US012754483B2

(12) United States Patent
Enkisch et al.

(10) Patent No.: US 12,754,483 B2
(45) Date of Patent: Oct. 6, 2026

(54) MIRROR, OPTICAL SYSTEM AND METHOD FOR OPERATING AN OPTICAL SYSTEM

(71) Applicant: Carl Zeiss SMT GmbH, Oberkochen (DE)

(72) Inventors: Hartmut Enkisch, Aalen (DE); Toralf Gruner, Aalen-Hofen (DE); Bernhard Gellrich, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 29 days.

(21) Appl. No.: 18/322,009

(22) Filed: May 23, 2023

(65) Prior Publication Data

US 2023/0305290 A1 Sep. 28, 2023

Related U.S. Application Data

(63) Continuation of application No. PCT/EP2021/082558, filed on Nov. 22, 2021.

(30) Foreign Application Priority Data

Jan. 28, 2021 (DE) ......................... 102021200790.2

(51) Int. Cl.
*G03F 7/00* (2006.01)

(52) U.S. Cl.
CPC ........ *G03F 7/70316* (2013.01); *G03F 7/7015* (2013.01); *G03F 7/702* (2013.01); (Continued)

(58) Field of Classification Search
CPC .. G02B 26/004; G02B 5/0891; G02B 7/1815; G02B 7/182; G02B 7/181; G02B 26/0825; G03F 7/70166; G03F 7/702; G03F 7/70266; G03F 7/70504; G03F 7/70525; G03F 7/70891; G03F 7/70; G03F 7/7015–70191; G03F 7/70258; G03F 7/70308; G03F 7/70316; G03F 7/70483–70541; G03F 7/7055;
(Continued)

(56) References Cited

U.S. PATENT DOCUMENTS 3,637,296 A 1/1972 Mclafferty et al.
3,731,992 A 5/1973 Mansell
(Continued)

FOREIGN PATENT DOCUMENTS

CN 112020674 A 12/2020
DE 10 2014 206 587 A1 4/2015
(Continued)

OTHER PUBLICATIONS

English translation of WO2020/079169-A1 (Year: 2020).*
(Continued)

*Primary Examiner* — Christina A Riddle
(74) *Attorney, Agent, or Firm* — Fish & Richardson P.C.

(57) ABSTRACT

A mirror, such as for a microlithographic projection exposure apparatus, comprises an optical effective surface. The mirror comprises a mirror substrate and a plurality of cavities in the mirror substrate. Fluid can be applied to each cavity. A deformation is transferable to the optical effective surface by varying the fluid pressure in the cavities. Related optical systems methods are provided.

15 Claims, 6 Drawing Sheets

(52) U.S. Cl.
CPC ...... *G03F 7/70266* (2013.01); *G03F 7/70504* (2023.05); *G03F 7/70525* (2013.01); *G03F 7/70891* (2013.01)

(58) Field of Classification Search
CPC ..... G03F 7/70591–706; G03F 7/70791; G03F 7/708; G03F 7/70808; G03F 7/70816; G03F 7/70825; G03F 7/70841; G03F 7/7085; G03F 7/70858–70891; G03F 7/709; G03F 7/70908; G03F 7/7095; G03F 7/70958; G03F 7/70975; G03F 7/70991
USPC ... 355/30, 43, 46, 50–55, 57, 60, 65, 66–77; 359/845, 846
See application file for complete search history.

(56) References Cited

U.S. PATENT DOCUMENTS

| | | | | |
|---|---|---|---|---|
| 4,264,146 | A | 4/1981 | Sutton | |
| 9,513,569 | B2 | 12/2016 | Dieterich et al. | |
| 2002/0011573 | A1 | 1/2002 | Van Dijsseldonk et al. | |
| 2004/0036940 | A1* | 2/2004 | Hazelton | G02B 26/0825 359/223.1 |
| 2005/0099611 | A1* | 5/2005 | Sogard | G02B 7/1815 359/845 |
| 2010/0020423 | A1 | 1/2010 | Phillips | |
| 2011/0255068 | A1* | 10/2011 | Kools | G03F 7/7015 355/71 |
| 2012/0075732 | A1* | 3/2012 | Griffith | G02B 26/0825 359/846 |
| 2013/0003167 | A1* | 1/2013 | Dieterich | G03F 7/70175 359/350 |
| 2014/0340659 | A1* | 11/2014 | Van Schoot | G03F 7/70858 355/30 |
| 2017/0315453 | A1 | 11/2017 | Bauer et al. | |
| 2023/0367227 | A1 | 11/2023 | Feldmann et al. | |

FOREIGN PATENT DOCUMENTS

| | | | | | |
|---|---|---|---|---|---|
| DE | 102019217530 | A1 | | 12/2019 | |
| DE | 10 2021 200 788 | A1 | | 7/2022 | |
| DE | 10 2021 207 580 | A1 | | 1/2023 | |
| EP | 1 174 770 | A2 | | 1/2002 | |
| EP | 1 376 192 | A2 | | 1/2004 | |
| EP | 1174770 | A3 | | 5/2004 | |
| EP | 2 258 656 | A1 | | 12/2010 | |
| JP | 2000221421 | A | * | 8/2000 | |
| WO | WO 2013/113634 | A2 | | 8/2013 | |
| WO | WO 2019/206637 | A1 | | 10/2019 | |
| WO | WO-2020079169 | A1 | * | 4/2020 | G02B 26/004 |

OTHER PUBLICATIONS

English translation of JP-2000221421 (Year: 2000).*

International Search Report and Written Opinion for corresponding PCT Appl No. PCT /EP2021/082558, dated Mar. 4, 2022.

GPTO-Office Action, with translation thereof, for corresponding DE Appl No. 10 2021 200 790.2, dated Jul. 8, 2021.

International Preliminary Report on Patentability for corresponding PCT Appl No. PCT /EP2021/082558, dated Aug. 10, 2023.

U.S. Appl. No. 18/357,540, filed Jul. 24, 2023, Heiko Feldmann.

Office Action in Taiwanese Appln. No. 111103453, mailed on Oct. 16, 2025, 17 pages (with English translation).

Search Report in Taiwanese Appln. No. 111103453, mailed on Oct. 13, 2025, 2 pages (with English translation).

Advisory Action in U.S. Appl. No. 18/357,540, mailed on Oct. 7, 2025, 3 pages.

Notice of Allowance received in U.S. Appl. No. 18/357,540, mailed on Mar. 10, 2026, 11 pages.

Final office Action received in U.S. Appl. No. 18/357,540, mailed on Aug. 29, 2025, 11 pages.

Office Action in U.S. Appl. No. 18/357,540, mailed on Apr. 16, 2025, 8 pages.

Notice of Allowance in U.S. Appl. No. 18/357,540, mailed on Jun. 9, 2026, 10 pages.

Office Action in Taiwanese Appln. No. 111103453, mailed on May 25, 2026, 13 pages (with English translation).

Search Report in Taiwanese Appln. No. 111103453, mailed on May 22, 2026, 3 pages (with English translation).

Office Action in Chinese Appln. No. 202180084466.2, mailed on Apr. 14, 2026, 24 pages (with English translation).

* cited by examiner

MIRROR, OPTICAL SYSTEM AND METHOD FOR OPERATING AN OPTICAL SYSTEM

CROSS-REFERENCE TO RELATED APPLICATIONS

The present application is a continuation of, and claims benefit under 35 USC 120 to, international application PCT/EP2021/082558, filed Nov. 22, 2021, which claims benefit under 35 USC 119 of German Application No. 10 2021 200 790.2, filed Jan. 28, 2020. The entire disclosure of these applications are incorporated by reference herein.

FIELD

The disclosure relates to a mirror, an optical system and to a method for operating an optical system, such as for a microlithographic projection exposure apparatus.

BACKGROUND

Microlithography is used for producing microstructured component parts, such as integrated circuits or LCDs. The microlithography process is performed in what is known as a projection exposure apparatus, which has an illumination device and a projection lens. The image of a mask (=reticle) that is illuminated via the illumination device is here projected onto a substrate (e.g. a silicon wafer), which is coated with a light-sensitive layer (photoresist) and is arranged in the image plane of the projection lens, via the projection lens in order to transfer the mask structure onto the light-sensitive coating of the substrate.

In projection lenses designed for the EUV range, i.e., at wavelengths of, e.g., approximately 13 nm or approximately 7 nm, mirrors are used as optical components for the imaging process owing to the general lack of availability of suitable light-transmissive refractive materials.

As a result of absorption of the radiation emitted by the EUV light source among other reasons, the EUV mirrors can heat up and can undergo an associated thermal expansion or deformation, which in turn can negatively affect the imaging properties of the optical system.

Various approaches are known for avoiding surface deformations caused by heat inputs into an EUV mirror and optical aberrations associated therewith. It is known, inter alia, to use a material with ultra-low thermal expansion ("Ultra Low Expansion Material"), for example a titanium silicate glass sold by Corning Inc. with the name ULE™, as the mirror substrate material and to set what is known as the zero-crossing temperature in a region near the optical effective surface. At this zero-crossing temperature, which lies at around $\vartheta$=30° C. for example for ULE™, the coefficient of thermal expansion, in its temperature dependence, has a zero crossing in the vicinity of which no thermal expansion or only negligible thermal expansion of the mirror substrate material takes place.

Further approaches for avoiding surface deformations caused by heat inputs into an EUV mirror include active direct cooling. In this case, ensuring a sufficiently efficient heat dissipation while simultaneously safeguarding high precision in respect of the optical effect of the mirror, however, can represent a very demanding challenge with increasing power of the light source.

For example, a cooling channel through which cooling fluid flows during operation of the optical system or mirror can itself supply parasitic contributions to the deformation of the optical effective surface of the mirror. Such contributions can result, firstly, from temperature gradients which form in the mirror substrate (and can be pronounced in the case of a low thermal conductivity of the mirror substrate material) and which, by way of the thermal expansion in the mirror substrate material, ultimately can contribute to the deformation of the optical effective surface depending on the cooling channel geometry. Moreover, the mechanical pressure transferred from the flowing cooling fluid to the mirror substrate via the cooling channel wall can also cause an elastic expansion of the mirror substrate material, which can supply a parasitic deformation contribution, which can depend on the cooling channel geometry, of the optical effective surface. The above-described issues can become ever more severe with increasing source power since the cooling power which is used to avoid thermally induced deformations and which is to be input in the respective mirror can also increase in that case.

SUMMARY

The present disclosure seeks to provide a mirror, an optical system and a method for operating an optical system, such as for a microlithographic projection exposure apparatus, which can facilitate an effective avoidance of thermally induced deformations while at least attenuating certain undesirable effects.

According to one aspect, the disclosure relates to a mirror, such as for a microlithographic projection exposure apparatus, wherein the mirror has an optical effective surface, comprising

- a mirror substrate; and
- a plurality of cavities which are arranged in the mirror substrate and to each of which a fluid can be applied;
- wherein a deformation is transferable to the optical effective surface by varying the fluid pressure in these cavities.

According to this aspect, the disclosure involves the concept of using the above-discussed contribution of a fluid pressure and the force that acts on the mirror substrate via the respective channel wall as a result thereof and that causes the elastic deformation of the mirror substrate to the ultimately obtained deformation of the optical effective surface in a targeted manner, as it were as a desirable effect, in order thus, as a result, to provide an adaptive mirror and hence an additional degree of freedom when setting the system wavefront generated by the optical system including the mirror. In this case, the disclosure proceeds from the realization that a suitable configuration (which will be described in more detail below) of the cavities, for example in respect of their dimensions and their distance from the optical effective surface can bring about the possibility of generating a deformation profile that firstly still varies in a targeted local fashion by way of an independent pressure application to the individual cavities but that secondly—in the case of a sufficient mutual "overlap" of adjacent cavities in respect of their deformation contribution—still allows the generation of a quasi-continuous deformation profile.

According to an embodiment, at least a subset of these cavities have the same distance from the optical effective surface.

According to an embodiment, the plurality of cavities have pairs of cavities stacked above one another in the direction of the optical effective surface such that a contribution to the deformation of the optical effective surface by way of a force component acting along the optical effective surface is generable by applying different fluid pressure to the cavities of one and the same pair.

According to this approach it is likewise possible—as an alternative or in addition to the suitable dimensioning of the individual cavities—to promote a quasi-continuous deformation profile (within the meaning of avoiding locally strictly delimited deformation effects of the individual cavities in each case), wherein the disclosure in this case also makes use of the principle, underlying the "bimetal effect", of generating deformations on account of mutually different expansions of two components affixed to one another in each case.

According to an embodiment, the fluid is a cooling fluid which flows through the cavities and serves to absorb the heat generated in the mirror substrate by electromagnetic radiation incident on the optical effective surface.

According to this approach, the fluid used to provide the desired deformation of the optical effective surface in the adaptive mirror according to the disclosure can serve as a cooling fluid at the same time. However, the disclosure is not restricted to this, and so the disclosure also provides embodiments without additional (cooling) functionality of the relevant fluid.

The disclosure also relates to an optical system comprising a mirror having the above-mentioned features. The optical system can be, for example, a projection lens or an illumination device of a microlithographic projection exposure apparatus According to a further aspect, the disclosure also relates to a method for operating an optical system, wherein the optical system has at least one mirror with an optical effective surface and a mirror substrate, wherein at least one cooling channel is arranged in the mirror substrate;

- wherein a cooling fluid with a variable cooling fluid temperature and a variable cooling fluid pressure flows through the cooling channel for the purposes of absorbing the heat generated in the mirror substrate by electromagnetic radiation that was generated by a light source and incident on the optical effective surface;
- wherein the cooling fluid temperature and cooling fluid pressure are varied depending on the power of the light source; and
- wherein this variation is implemented in such a way that a first parasitic contribution to the deformation of the optical effective surface, which is caused by a temperature gradient generated by the cooling fluid in the mirror substrate, and a second parasitic contribution to the deformation of the optical effective surface, which is caused by a mechanical pressure transferred from the cooling fluid to the mirror substrate, at least partly compensate one another.

For example, according to this aspect the disclosure involves the concept of, in an optical system comprising a mirror that is actively cooled by way of at least one cooling channel through which cooling fluid flows, avoiding or at least reducing unwanted contributions of this cooling channel and, for example, of its cooling channel geometry to the ultimately caused deformation of the optical effective surface of the mirror, by virtue of suitably varying the two parameters of "cooling fluid temperature" and "cooling fluid pressure" in such a way depending on the respective source power (i.e. the power of the light source) that the above-described parasitic effects (that is to say, firstly, the effect of a temperature gradient forming within the mirror substrate and, secondly, the effect of mechanical pressure exerted by the flowing cooling fluid by way of the cooling channel wall) can be "balanced" with respect to one another.

Here, the disclosure can use as a starting point the idea that a thermally induced surface deformation of a mirror which is impinged with electromagnetic (e.g., EUV) radiation during operation and which is actively cooled by way of at least one cooling channel through which cooling fluid flows can ultimately be determined by the three parameters of "source power", "cooling fluid temperature" and "cooling fluid pressure", wherein a minimization of thermally induced surface errors of the optical effective surface of the mirror and wavefront aberrations of the optical system resulting therefrom can be obtained by way of different suitable combinations of values (i.e., the different "value triples") of the parameters of source power, cooling fluid temperature and cooling fluid pressure.

By way of example, if an increased source power involves lowering the cooling fluid temperature, what a suitable additional adjustment of the cooling fluid pressure can achieve is that the respective parasitic contributions to the surface deformation of cooling fluid pressure and cooling fluid temperature are just balanced out with respect to one another such that, as a result, a minimal thermally induced disturbance or deformation of optical effective surface is maintained.

According to an embodiment, the variation of cooling fluid temperature and cooling fluid pressure is implemented at least in part on the basis of a preliminary calibration, within the scope of which combinations of the respective values of power of the light source, cooling fluid temperature and cooling fluid pressure that are suitable for this compensation are ascertained for the purposes of generating a lookup table.

Expressed differently, the variation of cooling fluid temperature and cooling fluid pressure can be implemented on the basis of a previously recorded characteristic, in which a variable characteristic for the respective residual disturbance or the surface error is specified (e.g., as an RMS value) for different value triples of the parameters of power of the light source, cooling fluid temperature and cooling fluid pressure. Then, should a change of two parameters (e.g., power of the light source and cooling fluid temperature) be used during the operation of the optical system or mirror, it is possible on the basis of this characteristic to directly ascertain, on the basis of the preliminary calibration, the value that should be chosen for the respective remaining parameter (e.g., the cooling fluid pressure) in order to reset the surface error to a value of nearly zero as a result.

According to a further embodiment, this ascertainment is implemented at least in part on the basis of wavefront measurements in the optical system and/or interferometric measurements of the figure of the mirror.

According to a further embodiment, this ascertainment of cooling fluid temperature and cooling fluid pressure is implemented at least in part on the basis of the simulation.

According to an embodiment, the variation of cooling fluid temperature and cooling fluid pressure is implemented at least in part on the basis of measurements of the current wavefront properties carried out during the ongoing operation of the optical system.

According to an embodiment, the mirror is designed for an operating wavelength of less than 30 nm, for example less than 15 nm.

According to an embodiment, the optical system is a projection lens or an illumination device of a microlithographic projection exposure apparatus.

Further, the disclosure also relates to an optical system comprising

- at least one mirror with an optical effective surface and a mirror substrate, wherein at least one cooling channel is arranged in the mirror substrate, wherein a cooling fluid with a variable cooling fluid temperature and variable cooling fluid pressure is able to flow through the cooling channel for the purposes of absorbing the heat generated in the mirror substrate by electromagnetic radiation that was generated by a light source and incident on the optical effective surface; and a device for varying cooling fluid temperature and cooling fluid pressure depending on the power of the light source, in such a way that a first parasitic contribution to the deformation of the optical effective surface, which is caused by a temperature gradient generated by the cooling fluid in the mirror substrate, and a second parasitic contribution to the deformation of the optical effective surface, which is caused by a mechanical pressure transferred from the cooling fluid to the mirror substrate, at least partly compensate each other.

According to an embodiment, the device is configured to vary cooling fluid temperature and cooling fluid pressure based on a lookup table containing different combinations of the respective values of power of the light source, cooling fluid temperature and cooling fluid pressure.

According to an embodiment, the device is configured to vary cooling fluid temperature and cooling fluid pressure based on a characteristic obtained by simulation and/or measurement or calibration, the characteristic specifying a respective resultant deformation of the optical effective surface of the mirror for different combinations of the values of the parameters of power of the light source, cooling fluid temperature and cooling fluid pressure. The optical system can for example comprise a memory or storage in which such a recorded characteristic (or characteristic map) is stored.

Further configurations of the disclosure can be gathered from the description and the dependent claims.

The disclosure is explained in greater detail below on the basis of exemplary embodiments illustrated in the accompanying figures.

DETAILED DESCRIPTION

Figure 6:
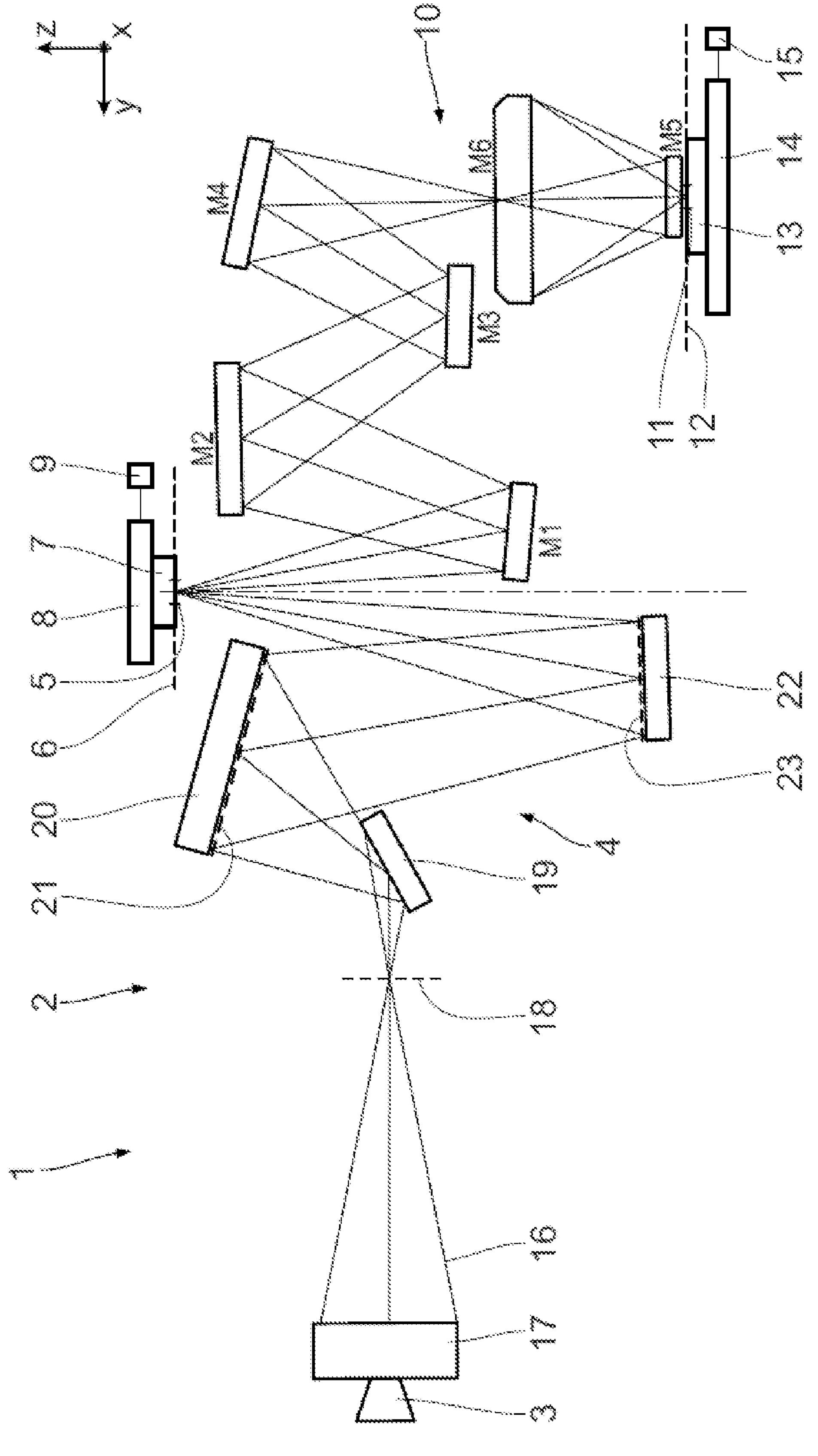
FIG. 6 shows a schematic illustration of the possible structure of a microlithographic projection exposure apparatus designed for operation in the EUV.

FIG. 6 initially schematically shows a meridional section of the possible setup of a microlithographic projection exposure apparatus designed for operation in the EUV range.

According to FIG. 6, the projection exposure apparatus 1 comprises an illumination device 2 and a projection lens 10. One embodiment of the illumination device 2 of the projection exposure apparatus 1 has, in addition to a light or radiation source 3, an illumination optical unit 4 for illuminating an object field 5 in an object plane 6. In an alternative embodiment, the light source 3 can also be provided as a separate module from the remaining illumination device. In this case, the illumination device does not comprise the light source 3.

Here, a reticle 7 arranged in the object field 5 is exposed. The reticle 7 is held by a reticle holder 8. The reticle holder 8 is displaceable by way of a reticle displacement drive 9, for example in a scanning direction. For purposes of explanation, a Cartesian xyz-coordinate system is depicted in FIG. 6. The x-direction runs perpendicularly to the plane of the drawing into the latter. The y-direction runs horizontally, and the z-direction runs vertically. The scanning direction in FIG. 6 runs along the y-direction. The z-direction runs perpendicular to the object plane 6.

The projection lens 10 serves for imaging the object field 5 into an image field 11 in an image plane 12. A structure on the reticle 7 is imaged onto a light-sensitive layer of a wafer 13 that is arranged in the region of the image field 11 in the image plane 12. The wafer 13 is held by a wafer holder 14. The wafer holder 14 is displaceable by way of a wafer displacement drive 15, for example along the y-direction. The displacement on the one hand of the reticle 7 by way of the reticle displacement drive 9 and on the other hand of the wafer 13 by way of the wafer displacement drive 15 can take place in such a way as to be synchronized with one another.

The radiation source 3 is an EUV radiation source. The radiation source 3 emits, for example, EUV radiation, which is also referred to below as used radiation or illumination radiation. For example, the used radiation has a wavelength in the range of between 5 nm and 30 nm. The radiation source 3 can be for example a plasma source, a synchrotron-based radiation source or a free electron laser (FEL). The illumination radiation 16 emanating from the radiation source 3 is focused by a collector 17 and propagates through an intermediate focus in an intermediate focal plane 18 into the illumination optical unit 4. The illumination optical unit 4 comprises a deflection mirror 19 and, disposed downstream thereof in the beam path, a first facet mirror 20 (having schematically indicated facets 21) and a second facet mirror 22 (having schematically indicated facets 23).

The projection lens 10 comprises a plurality of mirrors Mi (i=1, 2, . . . ), which are consecutively numbered in accordance with their arrangement in the beam path of the projection exposure apparatus 1. In the example illustrated in FIG. 6, the projection lens 10 comprises six mirrors M1 to M6. Alternatives with four, eight, ten, twelve or any other number of mirrors Mi are similarly possible. The penultimate mirror M5 and the last mirror M6 each have a through opening for the illumination radiation 16. The projection lens 10 is a doubly obscured optical unit. The projection lens 10 has an image-side numerical aperture that is greater than 0.5 and may also be greater than 0.6, and may be for example 0.7 or 0.75.

During operation of the microlithographic projection exposure apparatus 1, the electromagnetic radiation incident on the optical effective surface of the mirrors is partly absorbed and, as explained in the introduction, results in heating and an associated thermal expansion or deformation, which can in turn result in an impairment of the imaging properties of the optical system. The concept according to the disclosure can thus for example be applied advantageously to any mirror of the microlithographic projection exposure apparatus 1 of FIG. 6.

The disclosure is not limited to the application in a projection exposure apparatus that is designed for operation in the EUV range. For example, the disclosure can also advantageously be applied in a projection exposure apparatus that is designed for operation in the DUV range (that is to say at wavelengths of less than 250 nm, for example less than 200 nm), or in a different optical system.

Figure 1:
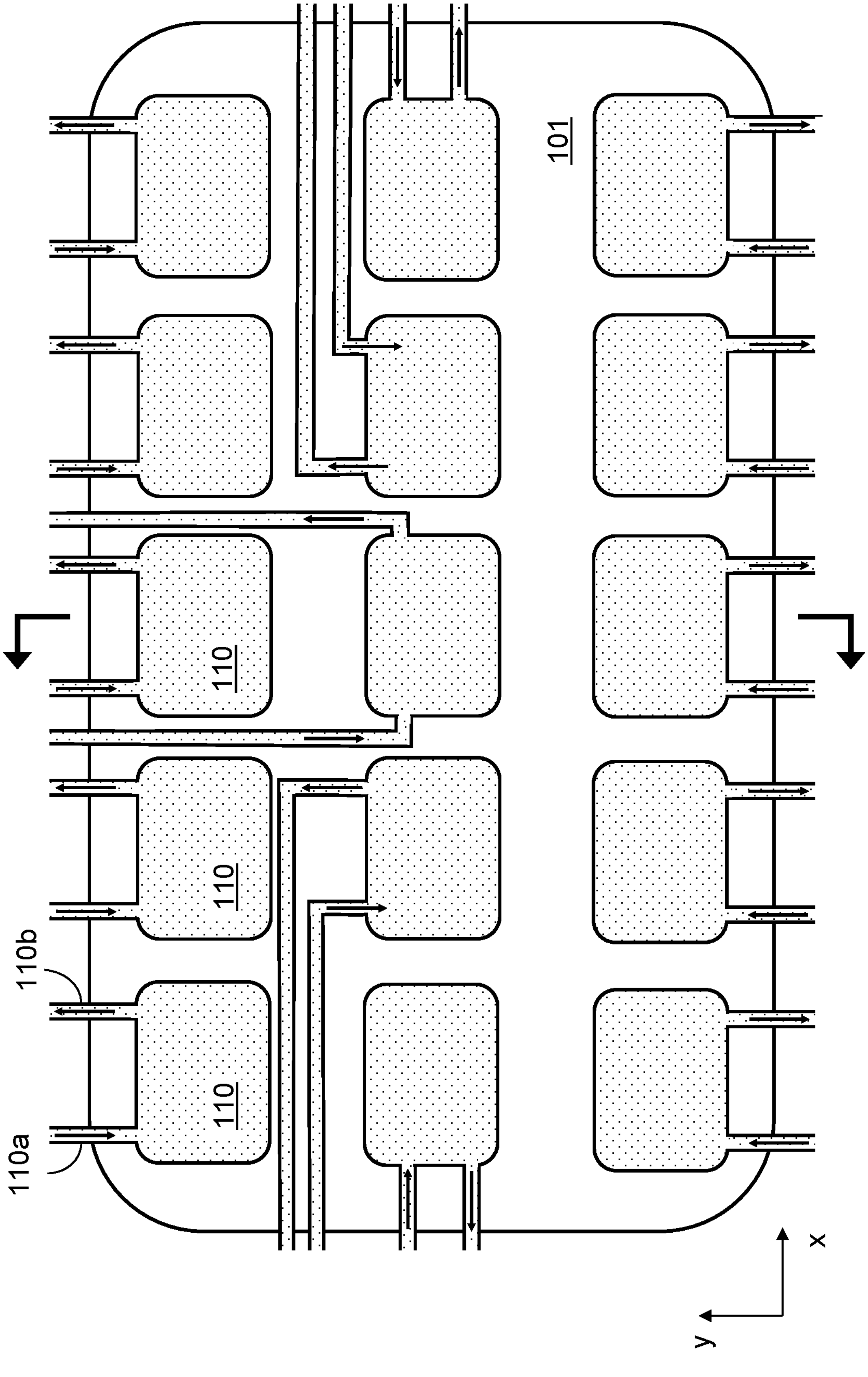
FIG. 1 shows a schematic illustration for explaining the possible structure of a mirror according to one embodiment of the disclosure.

FIG. 1 shows, merely in a schematic illustration, a possible embodiment of a mirror 100 according to the disclosure. The mirror 100 has a mirror substrate 101 (e.g., made of ULE™) and a reflection layer system (e.g., in the form of a molybdenum (Mo)—Silicon (Si) multiple layer stack)—not illustrated in FIG. 1. Within the mirror substrate 101 there are a plurality of cavities 110 (substantially shaped like a pocket in the exemplary embodiment), to which, once again independently of one another, a fluid can be applied in each case via a fluid inlet 110*a* and a fluid outlet 110*b* that lead to a region outside of the mirror substrate 101. The dimensions and the respective distance of the individual cavities 110 or pockets are suitably chosen, depending on mirror size, in such a way that by way of individual application of fluid pressure to the individual cavities 110, it is firstly still possible to obtain a sufficiently spatially resolved variation on the surface profile of the mirror 100 but, secondly, a continuous deformation profile still is obtained—as a consequence of a sufficient "depth" of the arrangement of cavities 110 within the mirror substrate 101 from the optical effective surface.

In exemplary embodiments, the distance of the individual cavities 110 or pockets from the optical effective surface can range from 2 mm to 100 mm, for example from 3 mm to 50 mm, such as from 5 mm to 20 mm. Moreover, purely by way of example, the lateral dimensions of the cavities 110 or pockets may range from 5 mm to 150 mm. Likewise in purely exemplary fashion (and without the disclosure being restricted thereto), the lateral dimensions of the cavities 110 or pockets can be chosen depending on the mirror size, for example in such a way that of the order of 80% of the lateral cross-sectional area of the mirror 100 is "covered" by cavities or pockets and so the remaining 20% of the lateral mirror area correspond to the interstices between the cavities 110 or pockets.

The disclosure has no further restrictions in respect of the geometry of the individual cavities 110 or pockets, with however rounded structures as illustrated in FIG. 1 in exemplary fashion being optional both in order to avoid the occurrence of unwanted mechanical stress peaks in the mirror substrate material and also from manufacturing points of view.

In embodiments of the disclosure the individual cavities 110 or pockets can for example have the same distance from the optical effective surface in each case (such that the arrangement of the cavities 110 in the depths of the mirror substrate 101 follows the surface form or the profile of the optical effective surface).

The mirror 100 is manufactured in such a way that the mirror substrate 101 can be assembled from separate mirror substrate parts, into which in turn the boundary surfaces of the cavities 110 to be formed in the finished mirror have been incorporated.

Figure 2:
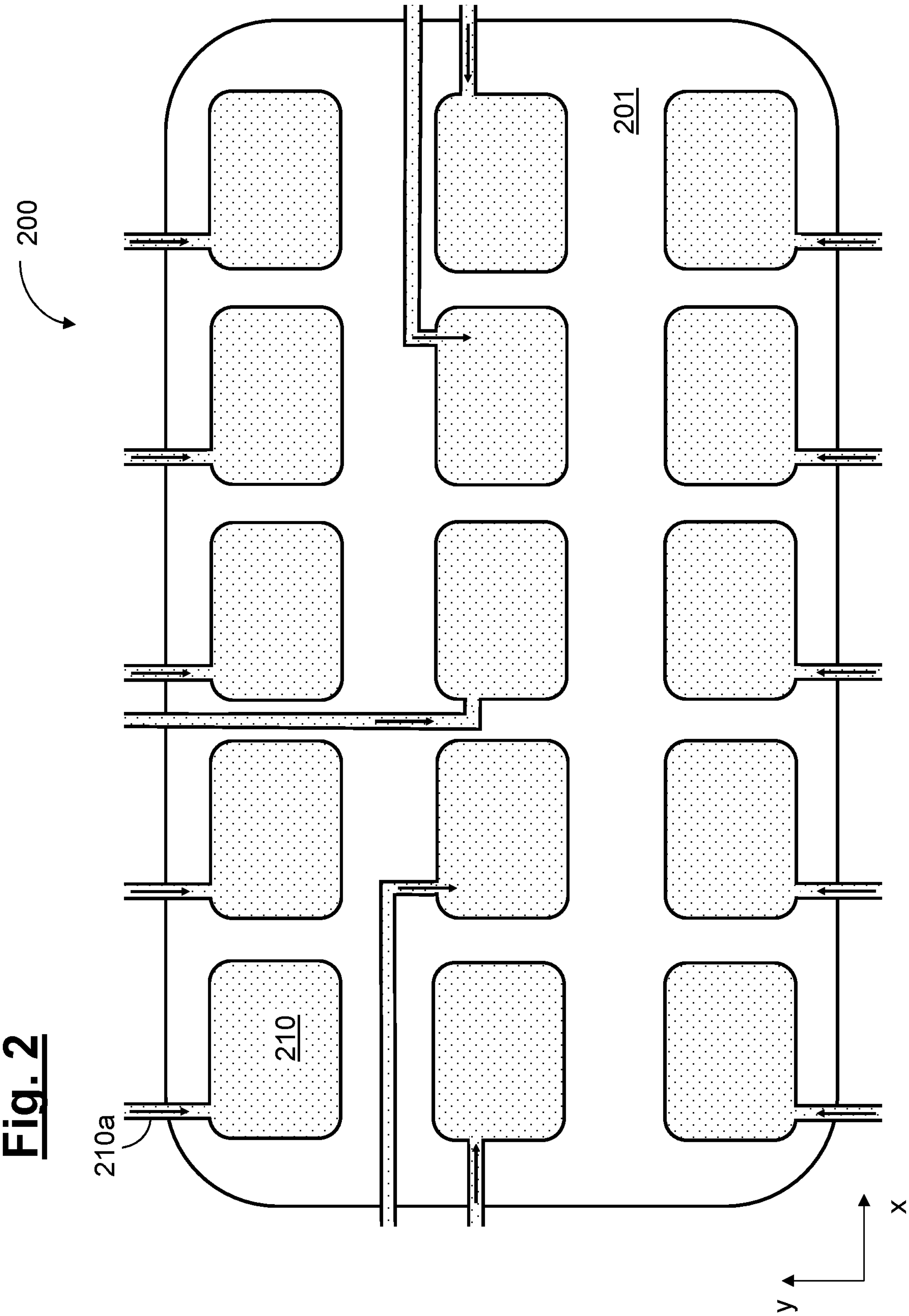
FIGS. 2-3 show schematic illustrations for explaining the possible structure of a mirror according to a further embodiment.

The fluid which is applied to the cavities 110 or pockets within the adaptive mirror 100 according to the disclosure can—without the disclosure being restricted thereto—be a cooling fluid for example, wherein the respective fluid temperature can be set, for example depending on the source power in the optical system, in order to avoid or reduce unwanted thermally induced deformations of the mirror 100 on account of the impingement thereof with electromagnetic radiation. However, the disclosure is not restricted thereto. In this respect, FIG. 2 shows an embodiment (otherwise largely analogous to FIG. 1) in which the fluid serving to be applied to the individual cavities or pockets 210 has no additional cooling functionality. Accordingly, since there is also no need for a flow through the cavities 210, the individual cavities 210 or pockets as per FIG. 2 only have a fluid inlet 210*a* (and no additional fluid outlet).

Figure 3:
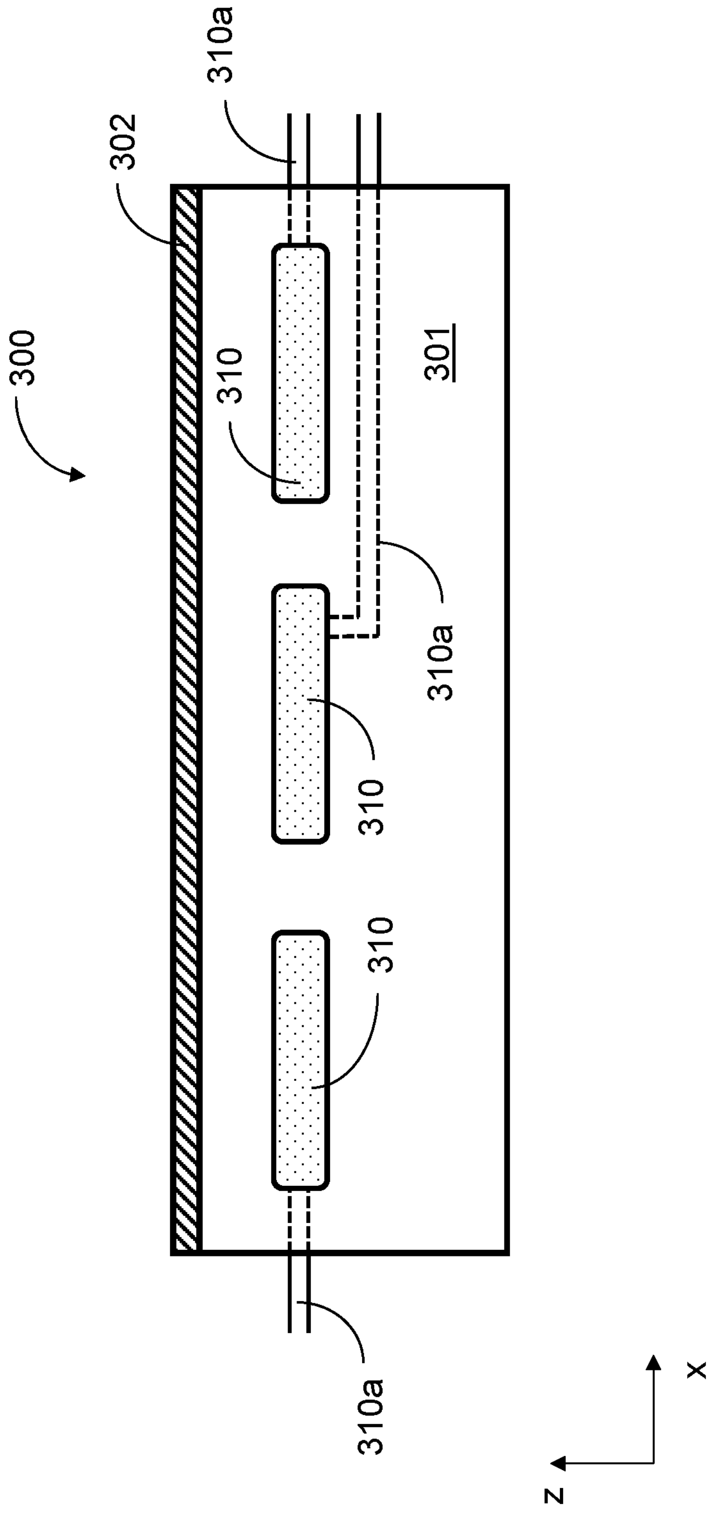

To simplify the manufacturing process, the fluid inlets 210*a* of the cavities 210 as per FIG. 2 or the cooling fluid inlets and outlets 110*a*, 110*b* as per FIG. 1 can each be arranged at the same level or depth as the associated cavities 210 and 110, respectively, and to this end can be incorporated into the corresponding substrate parts during the manufacture. However, an arrangement of feed lines in different planes can also be realized in further embodiments—as illustrated purely schematically in FIG. 3. Thus, in the example of FIG. 3 (which illustrates a mirror 300 with mirror substrate 301 and reflection layer system 302 in much simplified fashion), the central feed line 310*a* in an arrangement of three cavities 310 which each have a fluid feed line 310*a* is guided to the outside (i.e., into the region outside of the mirror substrate 301) at a greater depth or at a greater distance from the optical effective surface than the feed lines 310*a* leading to the adjacent cavities 310. In this case, possibly unwanted influencing of the deformation profile, which is set by way of the fluid application of the cavities 310, by way of the fluid pressure arising in the feed lines 310*a* is avoided while accepting an increased manufacturing outlay.

Figure 4A:
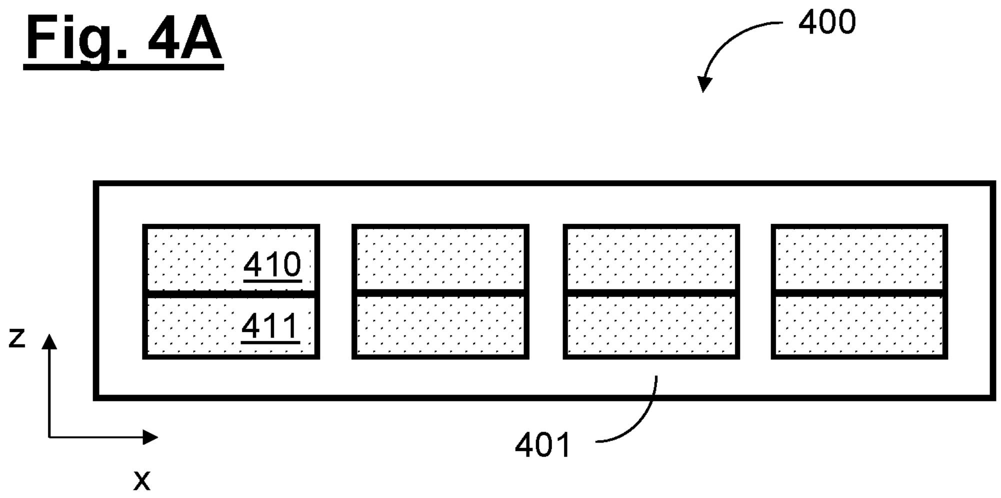
FIGS. 4A-4C show schematic illustrations for explaining structure and functioning of a mirror according to a further embodiment.
Figure 4B:
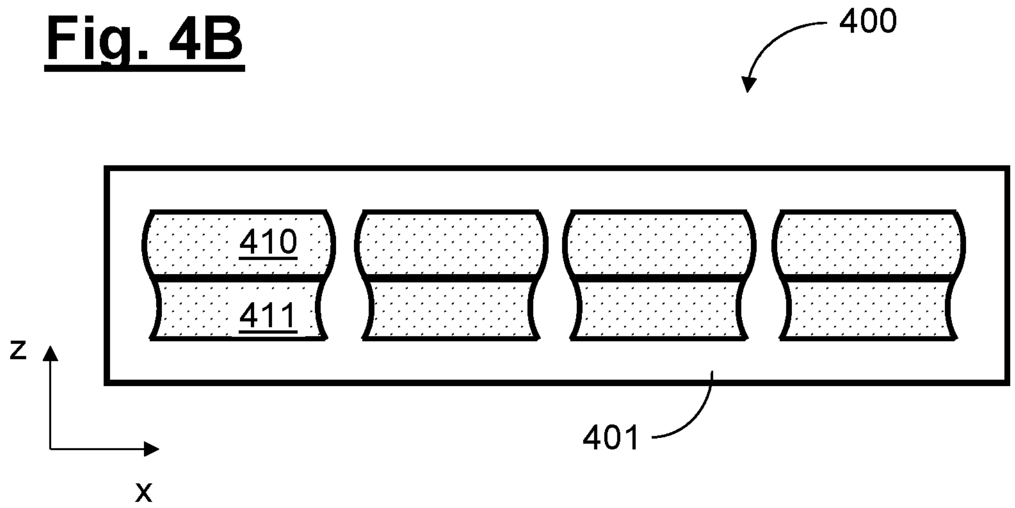
Figure 4C:
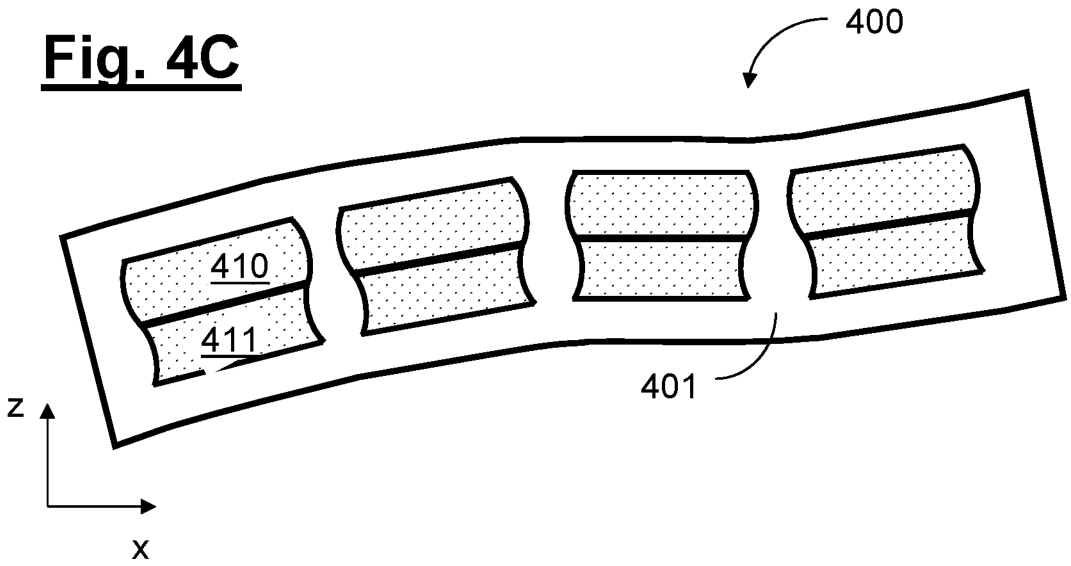

FIG. 4A-4C show schematic illustrations for explaining structure and functioning of an adaptive mirror 400 according to a further embodiment of the disclosure. According to this embodiment, pairs of cavities 410, 411 which are stacked above one another in the direction of the optical effective surface in each case are arranged within a mirror substrate 401, wherein the relevant cavities 410, 411 are able to be impinged independently of one another (by way of fluid inlets that are not illustrated in any of FIG. 4A-4C but are configured in a manner analogous to the embodiments described above). To separate the cavities 410, 411 stacked one above the other in each case, a plate made of, e.g., metallic material and having an exemplary thickness of the order of 1 mm may be arranged therebetween. In this case, the disclosure can make use for example of the fact that there is efficient cooling in the region of the plates during the operation of the optical system in the case where there is a flow through the cavities 410, 411, and so it is optionally possible to dispense with the use of a material with an ultra low thermal expansion such as ULE™ (which is likewise usable as a matter of principle).

An impingement of the cavities 410, 411 respectively belonging to one and the same pair with different fluid pressures as indicated in FIG. 4B now ultimately likewise has a deformation of the optical effective surface as a consequence, as indicated in FIG. 4C and as is analogous to the known bimetal effect. However, since this deformation in contrast to the embodiments described above on the basis of FIG. 1 to 3 is originally caused by a force component acting along the optical effective surface (corresponding to the different expansion of the cavities 410, 411 in the lateral direction or in the direction extending along the optical effective surface, as indicated in FIG. 4B), the basically desirable formation of a continuous deformation profile (within the meaning of avoiding a locally strictly separate deformation effect of the individual cavities) can additionally be assisted.

Figure 5:
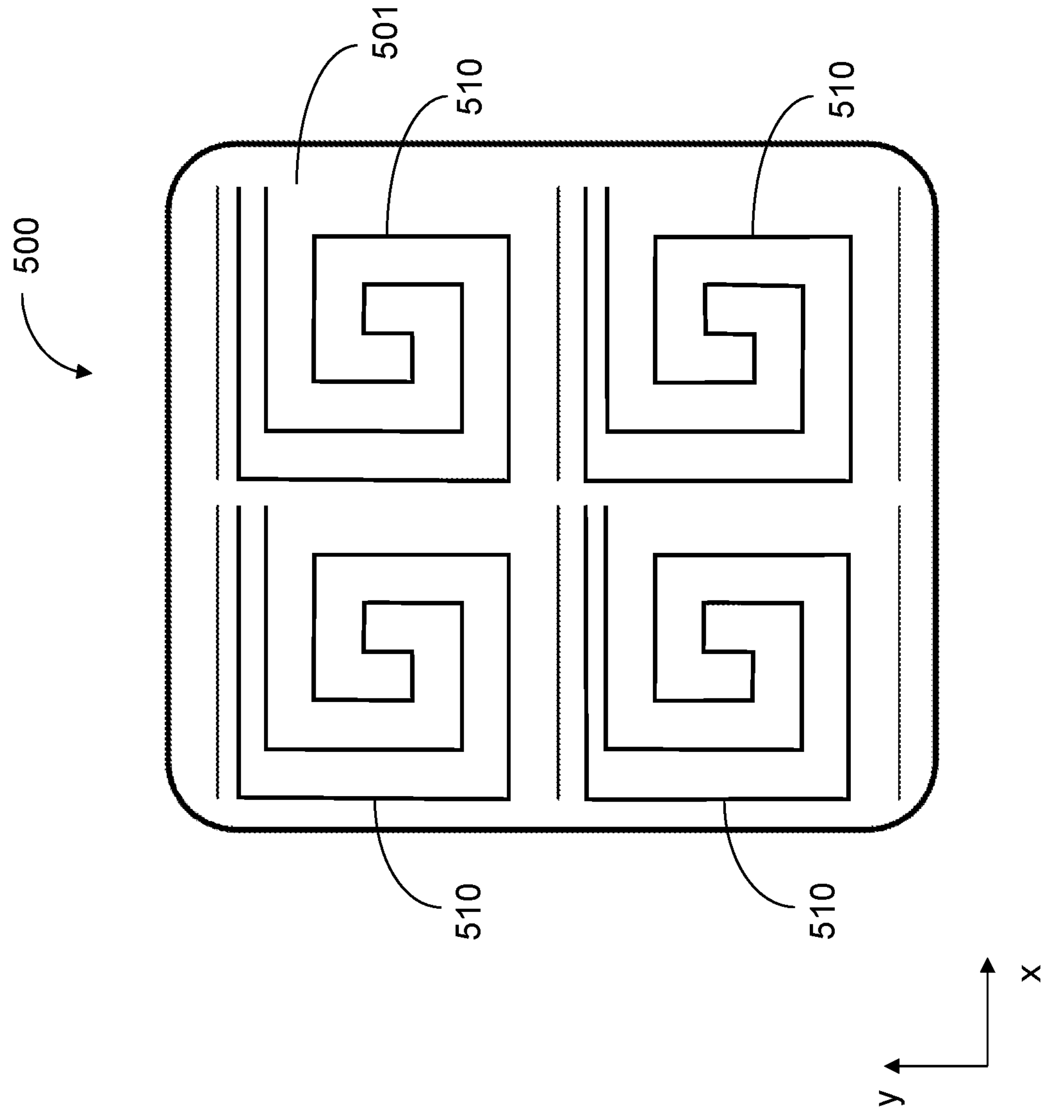
FIG. 5 shows a schematic illustration for explaining the possible structure of a mirror according to a further embodiment.

In respect of the cavities to which fluid is applied and which are located within the mirror substrate, the disclosure is not restricted to the pocket-shaped geometry chosen as per FIG. 1-3 and FIG. 4A-4C. For example, the cavities can also be configured in the form of channels, wherein once again separate channel sections can be formed for the purposes of realizing a plurality of regions to which fluid pressure can be applied independently of one another. In this respect, FIG. 5 once again shows merely an exemplary configuration, in which a plurality of separate channel sections which each have a substantially meandering geometry in the exemplary embodiment and which are each connected to a fluid inlet and a fluid outlet are provided as cavities 510 within a mirror substrate 501 in a mirror 500. Such a geometry of the channel sections forming the cavities 510 can be advantageous, for example in embodiments with a configuration of the utilized fluid as a cooling fluid, in order to avoid an introduction of unwanted time-varying vibrations into the mirror 500 on account of the flowing (cooling) fluid.

In the case of a configuration of the fluid as a cooling fluid that flows through the mirror substrate of a mirror there is, according to a further aspect of the present disclosure, a suitable variation of firstly the cooling fluid temperature and secondly the cooling fluid pressure depending on the respective source power of the source generating the electromagnetic radiation incident on the mirror, in such a way that parasitic effects of firstly a temperature gradient forming within the mirror substrate and secondly a mechanical pressure exerted by the flowing cooling fluid by way of the cooling channel wall balance one another. Expressed differently, a suitable adjustment of the cooling fluid pressure can avoid that a change in the cooling fluid temperature (e.g., rendered desirable as a consequence of an increasing source power) leads to an unwanted parasitic deformation contribution as a result of the temperature gradient forming within the mirror substrate.

In this case, an appropriate characteristic can be recorded (by simulation and/or measurement or calibration), for example in advance, in embodiments of the disclosure, the characteristic specifying the respective resultant disturbance or deformation of the optical effective surface of the mirror for different combinations of the values of the parameters of source power, cooling fluid temperature and cooling fluid pressure. As a result, this can achieve an efficient avoidance of thermally induced deformations, even in the case of high source powers, since parasitic contributions of the cooling channels through which cooling fluid flows in each case can be effectively avoided, even in the case of an increase in the cooling power to be introduced into the respective mirror.

Even though the disclosure was described using specific embodiments, a person skilled in the art will be able to see numerous variations and alternative embodiments, for example by combining and/or exchanging features of individual embodiments. Accordingly, it is obvious for a person skilled in the art that such variations and alternative embodiments are also encompassed by the present disclosure, and that the scope of the disclosure is limited only within the meaning of the attached patent claims and their equivalents.

What is claimed is:

1. A mirror, comprising:

an optical effective surface;

a mirror substrate comprising a substrate material, the substrate material having a plurality of cavities therein, each cavity being separated from the other cavities by the substrate material; and a plurality of fluid inlets and a plurality of fluid outlets, wherein:

each of the plurality of cavities comprises a fluid conduit;

each of the plurality of cavities is configured to have a fluid applied thereto;

a deformation is transferable to the optical effective surface by varying a fluid pressure in the plurality of cavities;

each of the plurality of cavities has a corresponding fluid inlet and a corresponding fluid outlet; and each of the fluid inlets and the fluid outlets is present in an outer perimeter of the substrate.

2. The mirror of claim 1, further comprising a cooling fluid in the cavities, wherein the cavities are configured to have the cooling fluid flow therethrough to absorb heat generated in the mirror substrate due to electromagnetic radiation incident on the optical effective surface during use of the mirror.

3. An optical system, comprising:

a mirror according to claim 1, wherein the optical system is a microlithographic optical system.

4. A method of using a microlithographic projection exposure apparatus comprising a projection lens and an illumination device, the method comprising:

using the illumination device to illuminate a reticle in an object plane of the projection lens; and using the projection lens to image the illuminated reticle onto a light-sensitive material in an image plane of the projection lens, wherein the microlithographic projection exposure apparatus comprises a mirror according to claim 1.

5. The mirror of claim 1, wherein the plurality of cavities comprises pairs of cavities stacked above one another in a direction of the optical effective surface so that a force component acting along the optical effective surface is generatable by applying different fluid pressures to the cavities of the same pair of cavities.

6. The mirror of claim 1, wherein each of the plurality of cavities is pocket-shaped.

7. The mirror of claim 1, wherein each of the plurality of cavities is defined by a wall formed of the substrate material.

8. The mirror of claim 1, wherein:

the substrate comprises a plurality of substrate parts separating the cavities from each other; and each cavity is defined by multiple substrate parts.

9. The mirror of claim 1, wherein for each cavity:

the fluid conduit is present in an outer perimeter of the substrate;

along a direction parallel to the outer perimeter of the substrate, the cavity is larger than the fluid conduit.

10. A method for operating an optical system comprising a mirror, the mirror comprising an optical effective surface and a mirror substrate, the mirror substrate having a cooling channel arranged therein, the method comprising:

flowing through the cooling channel to absorb heat generated in the mirror substrate due to electromagnetic radiation impinging on the optical effective surface, the cooling fluid having a variable cooling fluid temperature and a variable cooling fluid pressure;

varying the cooling fluid temperature and the cooling fluid pressure depending on a power of a light source that generates the electromagnetic radiation so that first and second parasitic contributions to a deformation of the optical effective surface at least partly compensate one another, wherein the first parasitic contribution is caused by a temperature gradient generated by the cooling fluid in the cooling channel, and the second parasitic contribution is caused by a mechanical pressure transferred from the cooling fluid to the mirror substrate, and wherein the optical system is projection lens of a microlithographic projection exposure apparatus, and wherein varying the cooling fluid temperature and the cooling fluid pressure is at least partly based on a preliminary calibration, and ascertaining the preliminary calibration comprises generating a look up table comprising combinations of values of the power of the light source, the cooling fluid temperature and the cooling fluid pressure that are suitable for the at least partial compensation of the first and second parasitic contributions.

11. The method of claim 10, wherein ascertaining comprises using wavefront measurements of the projection lens.

12. The method of claim 10, wherein ascertaining comprises using a simulation.

13. The method of claim 10, further comprising measuring wavefront properties of the projection lens during operation of the projection lens, wherein varying the cooling fluid temperature and the cooling fluid pressure comprises using the measured wavefront properties of the projection lens.

14. The method of claim 10, wherein the electromagnetic radiation has a wavelength of less than 30 nm.

15. The method of claim 10, wherein ascertaining comprises using interferometric measurements of a figure of the mirror.

* * * * *